United States Patent
Tanaka

(10) Patent No.: US 7,629,671 B2
(45) Date of Patent: Dec. 8, 2009

(54) SEMICONDUCTOR DEVICE HAVING A RESIN PROTRUSION WITH A DEPRESSION AND METHOD MANUFACTURING THE SAME

(75) Inventor: Shuichi Tanaka, Chino (JP)

(73) Assignee: Seiko Epson Corporation (JP)

( * ) Notice: Subject to any disclaimer, the term of this patent is extended or adjusted under 35 U.S.C. 154(b) by 369 days.

(21) Appl. No.: 11/481,332

(22) Filed: Jul. 5, 2006

(65) Prior Publication Data

US 2007/0007671 A1 Jan. 11, 2007

(30) Foreign Application Priority Data

Jul. 6, 2005 (JP) ............... 2005-197929

(51) Int. Cl.
*H01L 29/06* (2006.01)
*H01L 21/00* (2006.01)

(52) U.S. Cl. ............... 257/622; 257/623; 257/730; 257/786; 438/125

(58) Field of Classification Search ............ None
See application file for complete search history.

(56) References Cited

U.S. PATENT DOCUMENTS

| | | | |
|---|---|---|---|
| 4,982,265 A | 1/1991 | Watanabe et al. | |
| 5,138,438 A | 8/1992 | Masayuki et al. | |
| 5,517,752 A | 5/1996 | Sakata et al. | |
| 5,587,341 A | 12/1996 | Masayuki et al. | |
| 5,708,298 A | 1/1998 | Masayuki et al. | |
| 5,910,685 A | 6/1999 | Watanabe et al. | |
| 6,262,488 B1 | 7/2001 | Masayuki et al. | |
| 6,424,030 B2 | 7/2002 | Masayuki et al. | |
| 6,521,993 B2 | 2/2003 | Masayuki et al. | |
| 6,693,346 B2 | 2/2004 | Masayuki et al. | |
| 2006/0091539 A1 | 5/2006 | Tanaka | |

FOREIGN PATENT DOCUMENTS

| | | |
|---|---|---|
| JP | 02-272737 | 11/1990 |
| JP | 06-177214 | 6/1994 |
| JP | 11-067776 | 3/1999 |
| JP | 2002-280487 | 9/2002 |
| JP | 2004-140116 | 5/2004 |
| JP | 2005-101527 | 4/2005 |
| JP | 2005-109110 | 4/2005 |
| JP | 2005-136402 | 5/2005 |
| JP | 2005-310815 | 11/2005 |
| JP | 2005-340761 | 12/2005 |
| JP | 2005-353983 | 12/2005 |
| JP | 2006-128364 | 5/2006 |
| KR | 1997-0003914 | 3/1997 |

*Primary Examiner*—Alonzo Chambliss
(74) *Attorney, Agent, or Firm*—Harness, Dickey & Pierce, P.L.C.

(57) ABSTRACT

A semiconductor device including a semiconductor substrate having a plurality of electrodes, a resin protrusion formed on the semiconductor substrate, and an interconnect electrically connected to the electrodes and formed to extend over the resin protrusion. A depression is formed in a top surface of the resin protrusion. The interconnect has a cut portion disposed over at least part of the depression.

4 Claims, 6 Drawing Sheets

SEMICONDUCTOR DEVICE HAVING A RESIN PROTRUSION WITH A DEPRESSION AND METHOD MANUFACTURING THE SAME

Japanese Patent Application No. 2005-197929, filed on Jul. 6, 2005, is hereby incorporated by reference in its entirety.

BACKGROUND OF THE INVENTION

The present invention relates to a semiconductor device and a method of manufacturing the same.

In order to reduce the size of electronic parts, it is desirable that a semiconductor device have a small external shape. On the other hand, along with diversification of semiconductor devices, the degree of integration of integrated circuits formed on a semiconductor chip and the number of pins of the semiconductor chip have been increased. At present, a semiconductor device is demanded which can achieve a reduction in size of the semiconductor device and an increase in the degree of integration of the integrated circuit.

A semiconductor device in which interconnects are formed on a semiconductor chip has attracted attention as a semiconductor device which can satisfy such a demand (see JP-A-2-272737). This type of semiconductor device allows the external shape of the semiconductor device to be made approximately equal to the external shape of the semiconductor chip, whereby the size of the semiconductor device can be reduced.

This semiconductor device is also required to exhibit high reliability and excellent mounting capability. A method is also demanded which allows efficient manufacture of this semiconductor device while ensuring reliability.

SUMMARY

According to a first aspect of the invention, there is provided a semiconductor device comprising:

a semiconductor substrate having an electrode;

a resin protrusion formed on the semiconductor substrate and having a depression formed in a top surface of the resin protrusion; and an interconnect electrically connected to the electrode and formed to extend over the resin protrusion, the interconnect having a cut portion disposed over at least part of the depression.

According to a second aspect of the invention, there is provided a semiconductor device comprising:

a semiconductor substrate having an electrode;

a resin protrusion formed on the semiconductor substrate and having a depression formed in a top surface of the resin protrusion; and an interconnect electrically connected to the electrode and formed to extend over the resin protrusion, the interconnect having a through-hole disposed over at least part of the depression.

According to a third aspect of the invention, there is provided a method of manufacturing a semiconductor device, comprising:

providing a semiconductor substrate having an electrode;

forming a resin protrusion on the semiconductor substrate;

forming an interconnect which is electrically connected to the electrode, extends over a top surface of the resin protrusion, and has a cut portion disposed over the top surface of the resin protrusion; and removing part of the resin protrusion to form a depression disposed under the cut portion.

According to a fourth aspect of the invention, there is provided a method of manufacturing a semiconductor device, comprising:

providing a semiconductor substrate having an electrode;

forming a resin protrusion on the semiconductor substrate;

forming an interconnect which is electrically connected to the electrode, extends over a top surface of the resin protrusion, and has a through-hole disposed over the top surface of the resin protrusion; and removing part of the resin protrusion to form a depression disposed under the through-hole.

DETAILED DESCRIPTION OF THE EMBODIMENTS

Figure 1A:
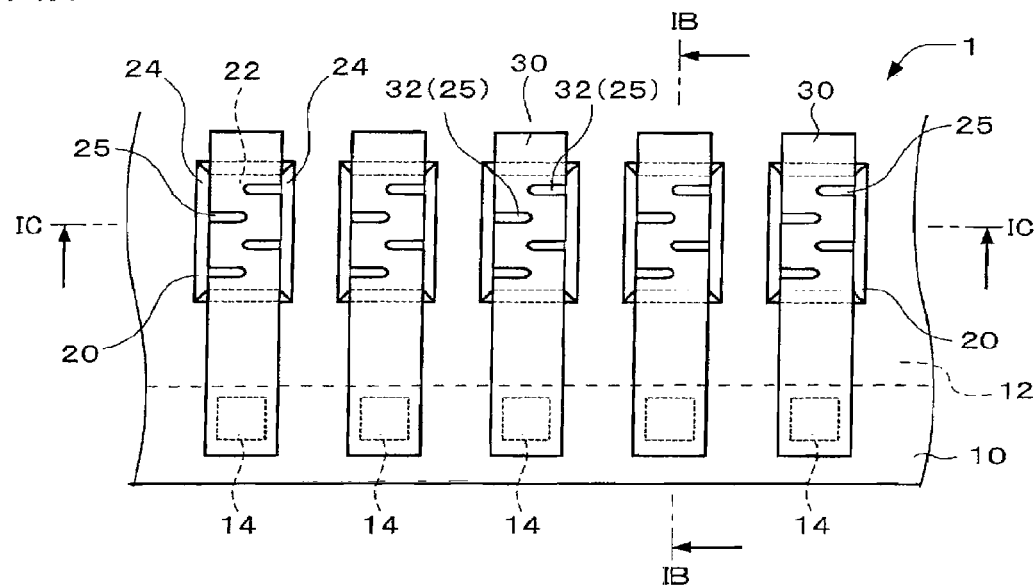
FIGS. 1A to 1C are diagrams illustrative of a semiconductor device according to a first embodiment to which the invention is applied.

The invention may provide a semiconductor device exhibiting excellent mounting capability and a method of manufacturing the same.

(1) According to one embodiment of the invention, there is provided a semiconductor device comprising:

a semiconductor substrate having an electrode;

a resin protrusion formed on the semiconductor substrate and having a depression formed in a top surface of the resin protrusion; and an interconnect electrically connected to the electrode and formed to extend over the resin protrusion, the interconnect having a cut portion disposed over at least part of the depression.

This embodiment makes it possible to provide a semiconductor device exhibiting excellent mounting capability.

(2) According to one embodiment of the invention, there is provided a semiconductor device comprising:

a semiconductor substrate having an electrode;

a resin protrusion formed on the semiconductor substrate and having a depression formed in a top surface of the resin protrusion; and an interconnect electrically connected to the electrode and formed to extend over the resin protrusion, the interconnect having a through-hole disposed over at least part of the depression.

This embodiment makes it possible to provide a semiconductor device exhibiting excellent mounting capability.

(3) In the above semiconductor devices,
the through-hole may be formed to extend along the interconnect and reach a lower portion of the resin protrusion.

(4) In the above semiconductor devices,
the top surface of the resin protrusion may be flat.

(5) According to one embodiment of the invention, there is provided a method of manufacturing a semiconductor device, comprising:

providing a semiconductor substrate having an electrode;
forming a resin protrusion on the semiconductor substrate;
forming an interconnect which is electrically connected to the electrode, extends over a top surface of the resin protrusion, and has a cut portion disposed over the top surface of the resin protrusion; and
removing part of the resin protrusion to form a depression disposed under the cut portion.

This embodiment makes it possible to manufacture a semiconductor device exhibiting excellent mounting capability.

(6) According to one embodiment of the invention, there is provided a method of manufacturing a semiconductor device, comprising:

providing a semiconductor substrate having an electrode;
forming a resin protrusion on the semiconductor substrate;
forming an interconnect which is electrically connected to the electrode, extends over a top surface of the resin protrusion, and has a through-hole disposed over the top surface of the resin protrusion; and
removing part of the resin protrusion to form a depression disposed under the through-hole.

This embodiment makes it possible to manufacture a semiconductor device exhibiting excellent mounting capability.

(7) In the above methods of manufacturing a semiconductor device,
the through-hole of the interconnect may be formed to extend along the interconnect and reach a lower portion of the resin protrusion.

(8) In the above methods of manufacturing a semiconductor device,
the top surface of the resin protrusion may be formed to be flat.

Embodiments to which the invention is applied are described below with reference to the drawings. Note that the invention is not limited to the following embodiments. The invention also includes configurations in which the following embodiments and modification are arbitrarily combined.

First Embodiment

Figure 1B:
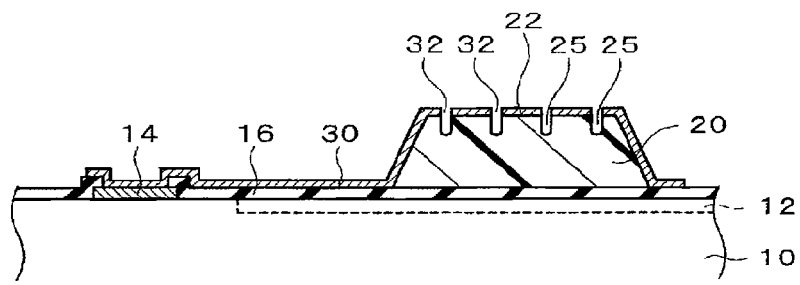
Figure 1C:
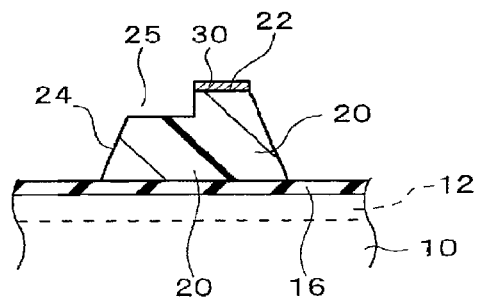

FIGS. 1A to 1C are views illustrative of a semiconductor device according to a first embodiment to which the invention is applied. FIG. 1A is a top view of a semiconductor device 1. FIGS. 1B and 1C are partially enlarged cross-sectional views along the line IB-IB and the line IC-IC in FIG. 1A, respectively.

As shown in FIGS. 1A to 1C, the semiconductor device according to this embodiment includes a semiconductor substrate 10. The semiconductor substrate 10 may be a silicon substrate or the like. The semiconductor substrate 10 may be in the shape of a chip (see FIG. 3). The surface (active surface) of the semiconductor substrate 10 on which electrodes 14 are formed may be rectangular. Note that the active surface of the semiconductor substrate 10 may be square (not shown). The semiconductor substrate 10 may be in the shape of a wafer (see FIG. 4). One or more integrated circuits 12 may be formed on the semiconductor substrate 10 (one integrated circuit 12 may be formed on a semiconductor chip, and a plurality of integrated circuits 12 may be formed on a semiconductor wafer) (see FIG. 1B). The configuration of the integrated circuit 12 is not particularly limited. For example, the integrated circuit 12 may include an active element such as a transistor and a passive element such as a resistor, coil, or capacitor.

As shown in FIGS. 1A and 1B, the semiconductor substrate 10 is provided with the electrodes 14. The electrode 14 may be electrically connected with the inside of the semiconductor substrate 10. The electrode 14 may be electrically connected with the integrated circuit 12. A conductor which is not electrically connected with the integrated circuit 12 may also be referred to as the electrode 14. The electrode 14 may be part of an internal interconnect of the semiconductor substrate. In this case, the electrode 14 may be part of the internal interconnect of the semiconductor substrate used for electrical connection with the outside. The electrode 14 may be formed of a metal such as aluminum or copper.

As shown in FIGS. 1B and 1C, the semiconductor substrate 10 may include a passivation film 16. The passivation film 16 may be formed to expose the electrode 14. The passivation film 16 may have an opening which exposes the electrode 14. The passivation film 16 may be formed to partially cover the electrode 14. The passivation film 16 may be formed to cover the edge of the electrode 14. The passivation film may be an inorganic insulating film formed of $SiO_2$, SiN, or the like. The passivation film 16 may be an organic insulating film formed of a polyimide resin or the like.

As shown in FIGS. 1A to 1C, the semiconductor device according to this embodiment includes a resin protrusion 20 formed on the semiconductor substrate 10. The resin protrusion 20 may be formed on the passivation film 16. The material for the resin protrusion 20 is not particularly limited. A known material may be used as the material for the resin protrusion 20. For example, the resin protrusion 20 may be formed using a resin such as a polyimide resin, silicone-modified polyimide resin, epoxy resin, silicone-modified epoxy resin, benzocyclobutene (BCB), polybenzoxazole (PBO), or phenol resin.

In the semiconductor device according to this embodiment, a plurality of resin protrusions 20 may be formed on one semiconductor substrate 10. In this case, the resin protrusions 20 may be arranged along the side of the surface (active surface) of the semiconductor substrate 10 on which the electrodes 14 are formed (see FIG. 1A).

As shown in FIGS. 1A to 1C, a depression 25 is formed in a top surface 22 of the resin protrusion 20. The depression 25 is formed over a cut portion 32 in an interconnect 30 described later. The depression 25 may be in the shape of a groove. For example, the depression 25 may be a groove extending parallel to the side of the semiconductor substrate 10. In other words, the depression 25 may be a groove extending in the direction which intersects the direction in which the interconnect 30 (described later) extends. The depression 25 may be formed to reach (communicate with) a side surface 24 of the resin protrusion 20 (see FIG. 1C). The top surface 22 of the resin protrusion 20 may be referred to as the region of the resin protrusion 20 which faces an interconnect 42 of a circuit board 40 described later.

The top surface 22 of the resin protrusion 20 may be flat (see FIGS. 1B and 1C). In more detail, the region of the top surface 22 in which the depression 25 is not formed may be flat. The resin protrusion 20 may have a shape in which the top surface 22 is smaller than the bottom surface. Specifically, the resin protrusion 20 may be in the shape of a truncated cone or a truncated pyramid. The term "truncated cone" used herein also includes a truncated cone of which the bottom surface is not precisely circular. Likewise, the term "truncated pyramid" used herein also includes a truncated pyramid of which the bottom surface is not precisely polygonal. For example, the bottom surface of the resin protrusion 20 may be in the shape of a polygon with four or more sides and round corners. The top surface 22 of the resin protrusion 20 may be curved (not shown).

As shown in FIGS. 1A to 1C, the semiconductor device according to this embodiment includes the interconnects 30. The interconnect 30 is electrically connected with the electrode 14. The interconnect 30 is formed to extend over the resin protrusion 20. The interconnect 30 is formed to extend over the top surface 22 of the resin protrusion 20.

The cut portion 32 is formed in the interconnect 30. The cut portion 32 may be formed (only) in the region over the resin protrusion 20. The cut portion 32 is formed over at least part of the depression 25. The cut portion 32 may be formed over the entire depression 25. In this case, the cut portion 32 may have the same shape as the depression 25. The cut portion 32 may be formed to have a size greater than that of the depression 25. The cut portion 32 may be formed over part of the depression 25. In this case, the cut portion 32 may be formed to have a size smaller than that of the depression 25. The cut portion 32 may be formed to expose part of the depression 25. In other words, the cut portion 32 is formed to communicate with the depression 25. The cut portion 32 may extend in the direction which intersects the direction in which the interconnect 30 extends. Specifically, the cut portion 32 may extend parallel to the side of the semiconductor substrate 10. In this case, the cut portion 32 may extend across the center of the interconnect 30. The cut portions 32 may be formed from both sides of the interconnect 30. In this case, the cut portions 32 may be disposed at different positions in the direction in which the interconnect 30 extends.

In the semiconductor device according to this embodiment, one interconnect 30 may be formed over one resin protrusion 20, as shown in FIG. 1A. When the resin protrusion extends along one side of the semiconductor substrate 10, a plurality of interconnects 30 may be formed over one resin protrusion 20 (see FIGS. 7A and 8B).

The structure of the interconnect 30 is not particularly limited. For example, the interconnect 30 may be formed of a plurality of layers. In this case, the interconnect 30 may include a first layer formed of titanium tungsten and a second layer formed of gold (not shown). Or, the interconnect 30 may be formed of a single layer. The interconnect 30 may be formed to contact the passivation film 16. In this case, the interconnect 30 may be formed to contact the passivation film 16 on both sides of the resin protrusion 20. The interconnect 30 may be formed to contact the electrode 14. This may cause the interconnect 30 to be electrically connected with the electrode 14.

The semiconductor device according to this embodiment may have the above-described configuration. According to the semiconductor device 1, a highly reliable semiconductor device with excellent mounting capability can be provided. The reasons therefor are given below.

Figure 2A:
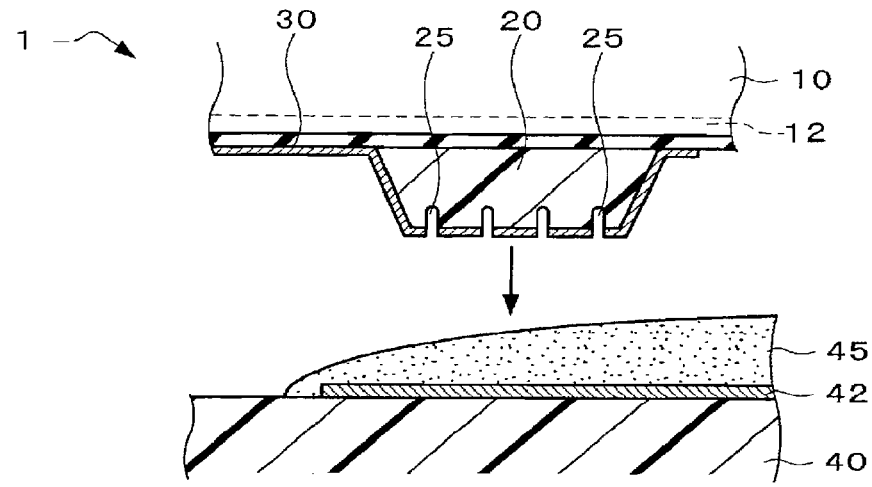
FIGS. 2A to 2C are diagrams illustrative of the semiconductor device according to the first embodiment.
Figure 2B:
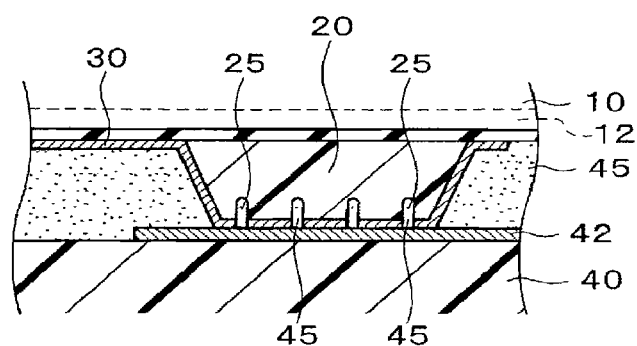
Figure 2C:
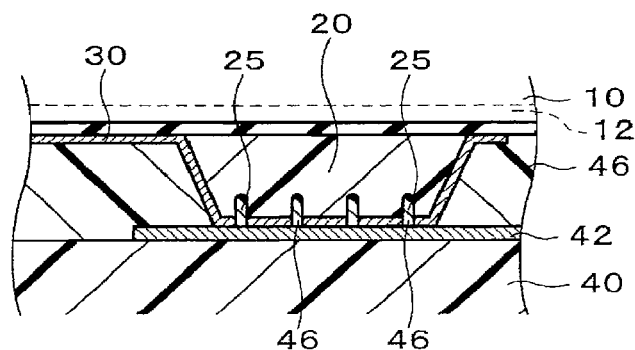

A method of mounting the semiconductor device on a circuit board is not particularly limited. An example of the method of mounting the semiconductor device 1 on the circuit board 40 is described below with reference to FIGS. 2A to 2C. As shown in FIG. 2A, the semiconductor device 1 is disposed on the circuit board 40 and positioned so that the interconnect 30 of the semiconductor device 1 faces the interconnect 42 of the circuit board 40. In this case, an adhesive 45 may be provided between the semiconductor device 1 and the circuit board 40. For example, the adhesive 45 may be provided on the circuit board 40 as shown in FIG. 2A. As shown in FIG. 2B, the semiconductor device 1 is pressed against the circuit board 40 to allow the interconnect 30 to contact the interconnect 42. In this case, the adhesive 45 may be spread using the semiconductor device 1 and the circuit board 40 so that the space between the semiconductor substrate 10 and the circuit board 40 is filled with the adhesive 45. In this case, the depression 25 in the resin protrusion 20 may be filled with the adhesive 45. As shown in FIG. 2C, the adhesive 45 may be cured to form an adhesive layer 46. A known adhesive may be used as the adhesive 45. For example, a resin-based adhesive may be used as the adhesive 45. A material which forms the adhesive layer 46 with a modulus of elasticity lower than that of the resin protrusion 20 (softer than the resin protrusion 20) may be used as the adhesive 45.

Figure 3:
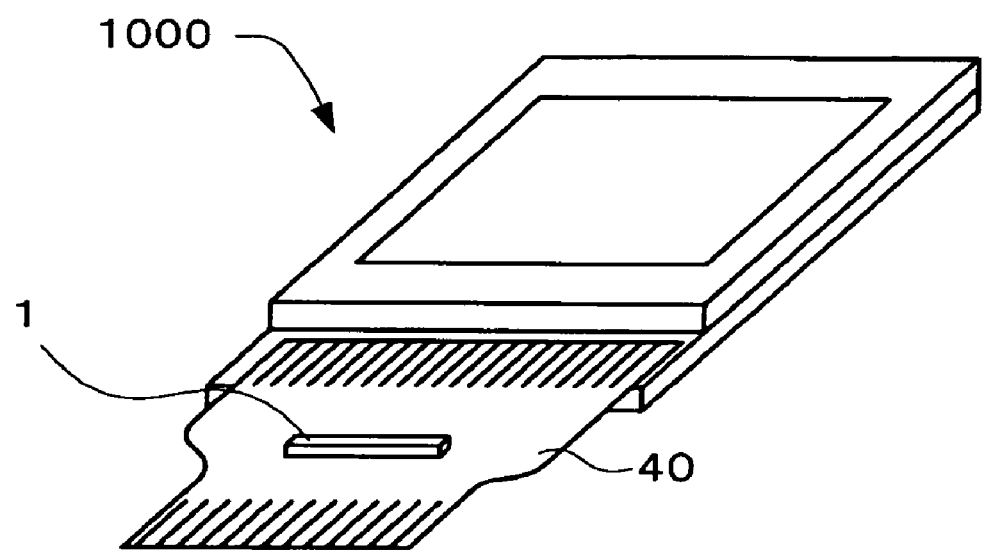
FIG. 3 is a diagram showing an electronic module on which the semiconductor device according to the first embodiment is mounted.

A step of cutting the circuit board 40 and the like may be carried out to obtain an electronic module 1000 shown in FIG. 3. The electronic module 1000 may be a display device. The display device may be a liquid crystal display device, an electroluminescent (EL) display device, or the like. The semiconductor device 1 may be a driver IC which controls the display device.

In general, a semiconductor device may be mounted on a circuit board in various ways. The semiconductor device 1 is suitable for a mounting method in which the interconnect 30 and the interconnect 42 are electrically connected in a state in which the interconnect 30 faces the interconnect 42, as described above. Specifically, since the interconnect 30 is formed to extend over the resin protrusion 20 (top surface 22), the interconnect 30 can be pressed against the interconnect 42 due to the elastic force of the resin protrusion 20. This allows manufacture of an electronic module 1000 which exhibits high electrical connection reliability between the interconnect 30 and the interconnect 42.

It is important that the interconnect 30 reliably contact the interconnect 42 when electrically connecting the interconnect 30 with the interconnect 42. Specifically, a highly reliable electronic module can be manufactured by mounting the semiconductor device 1 on the circuit board 40 so that the adhesive 45 does not remain between the interconnect 30 and the interconnect 42.

In the semiconductor device 1, the depression 25 is formed in the top surface of the resin protrusion 20, and the cut portion 32 disposed over at least part of the depression 25 is formed in the interconnect 30. Therefore, the adhesive 45 can enter the depression 25. As a result, the semiconductor device 1 ensures that the adhesive 45 rarely remains between the interconnect 30 and the interconnect 42. In more detail, since the adhesive 45 can enter the depression 25, as shown in FIG. 2B, the adhesive 45 rarely remains between the interconnect 30 and the interconnect 42. In particular, the adhesive 45 positioned near the center of the top surface 22 of the resin protrusion 20 can be removed from the space between the interconnect 30 and the interconnect 42 without causing the adhesive 45 to flow toward the outside of the top surface 22. This allows the interconnect 30 to reliably contact the interconnect 42. As a result, a highly reliable electronic module 1000 can be obtained.

In the electronic module 1000, the interconnect 30 of the semiconductor device 1 is pressed against the interconnect 42 due to the resin protrusion 20. This maintains the connection state of the interconnect 30 and the interconnect 42, as described above. On the other hand, it is important to prevent a large amount of stress from being applied to the interconnect 30 in order to maintain the reliability of the electronic module.

In the semiconductor device 1, the depression 25 is formed in the resin protrusion 20, and the cut portion 32 is formed in the interconnect 30. The cut portion 32 is disposed over at least part of the depression 25. This configuration allows the resin protrusion 20 and the interconnect 30 to be easily deformed. Therefore, when a large amount of force is applied to the interconnect 30, the resin protrusion 20 and the interconnect 30 are deformed to reduce the force applied to the interconnect 30. This prevents breakage of the interconnect 30. In particular, the top portion 22 of the resin protrusion 20 presses the interconnect 30 against the interconnect 42. Therefore, it is possible to reduce the stress occurring in the portion of the interconnect 30 in which the largest amount of force is applied by forming the depression 25 in the top portion 22 of the resin protrusion 20. A pressure necessary for maintaining electrical connection reliability can be ensured by adjusting the shape of the depression 25 and the cut portion 32.

Specifically, the semiconductor device 1 according to this embodiment allows provision of a semiconductor device which exhibits excellent mounting capability and high reliability after mounting.

Figure 4:
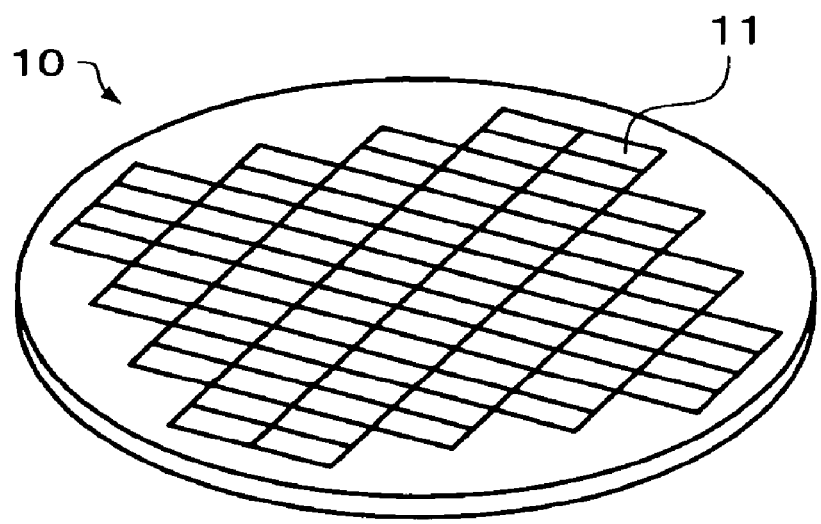
FIG. 4 is a diagram illustrative of a method of manufacturing a semiconductor device according to the first embodiment.

A method of manufacturing a semiconductor device according to the first embodiment is described below with reference to FIGS. 4 to 6.

The method of manufacturing a semiconductor device according to this embodiment may include providing the semiconductor substrate 10 provided with the electrode 14. As shown in FIG. 4, the semiconductor substrate 10 may be provided in the shape of a wafer. The semiconductor substrate 10 in the shape of a wafer may include regions 11 in which semiconductor devices are respectively formed. The semiconductor substrate 10 may be in the shape of a chip (see FIG. 3).

Figure 5:
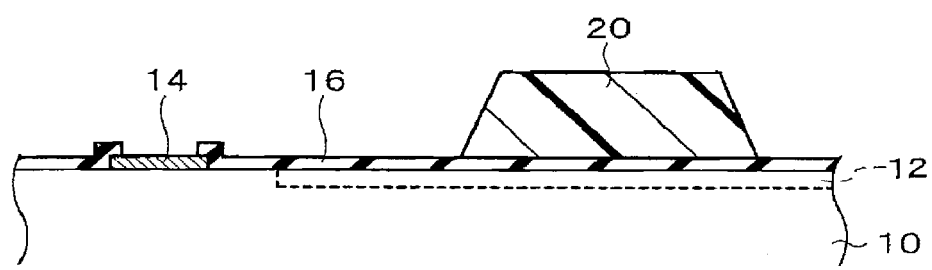
FIG. 5 is a diagram illustrative of the method of manufacturing a semiconductor device according to the first embodiment.

The method of manufacturing a semiconductor device according to this embodiment includes forming the resin protrusion 20 on the semiconductor substrate 10, as shown in FIG. 5. The resin protrusion 20 may be formed to have a flat top surface, as shown in FIG. 5. The formation method for the resin protrusion 20 is not particularly limited. For example, the resin protrusion 20 may be formed by providing a resin material on the semiconductor substrate 10 and curing the resin material. In this case, the resin material may be provided in the shape of a column or a prism and caused to shrink to form the resin protrusion 20 in the shape of a truncated cone or a truncated pyramid.

Figure 6:
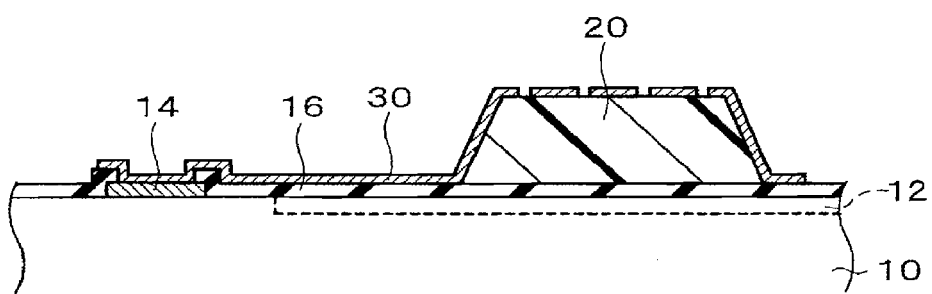
FIG. 6 is a diagram illustrative of the method of manufacturing a semiconductor device according to the first embodiment.

The method of manufacturing a semiconductor device according to this embodiment includes forming the interconnect 30 electrically connected with the electrode 14, as shown in FIG. 6. The interconnect 30 is formed to extend over the top surface of the resin protrusion 20. The interconnect 30 is formed to include the cut portion 32 which is formed in the region over the top surface of the resin protrusion 20. The formation method for the interconnect 30 is not particularly limited. For example, the interconnect 30 may be formed by depositing metal foil by sputtering and patterning the metal foil. The interconnect 30 may be formed to include the cut portion 32 by patterning the metal foil.

When an oxide film is formed on the surface of the electrode 14, the interconnect 30 may be formed after removing the oxide film. This ensures reliable electrical connection between the electrode 14 and the interconnect 30. The oxide film may be removed using a known method. For example, the oxide film may be removed using a method utilizing Ar gas.

The method of manufacturing a semiconductor device according to this embodiment includes removing part of the resin protrusion 20 to form the depression 25 in the resin protrusion 20 (see FIGS. 1A to 1C). The depression 25 may be formed from the top surface of the resin protrusion 20. The depression 25 is formed over the cut portion 32. For example, the depression 25 may be formed by etching using the interconnect 30 as a mask. This allows the depression 25 to be formed over the cut portion 32.

A step of cutting the semiconductor substrate 10 into individual pieces, an inspection step, and the like may be performed to obtain the semiconductor device 1.

Second Embodiment

Figure 7A:
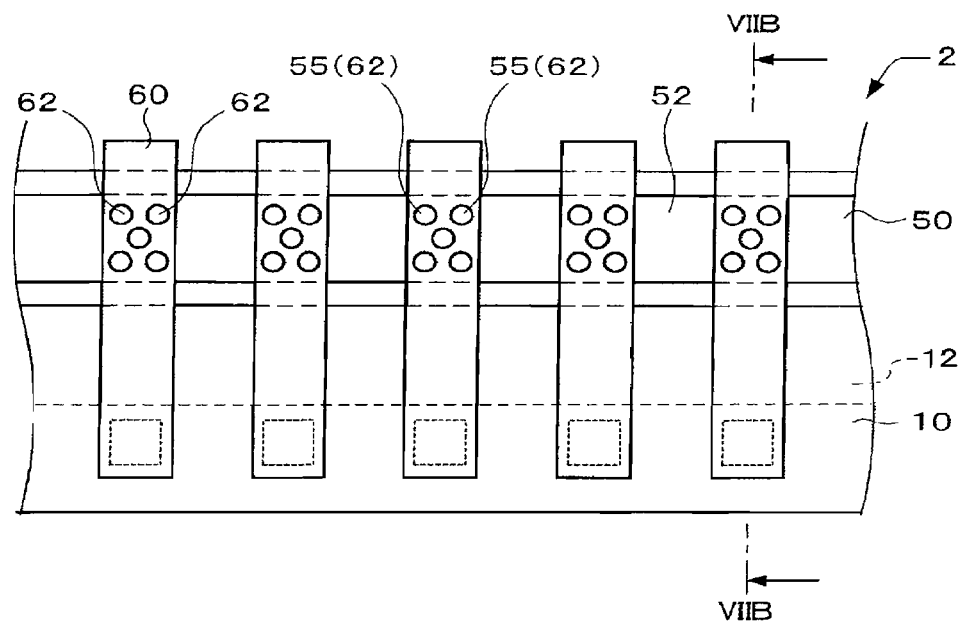
FIGS. 7A to 7B are diagrams illustrative of a semiconductor device according to a second embodiment to which the invention is applied.
Figure 7B:
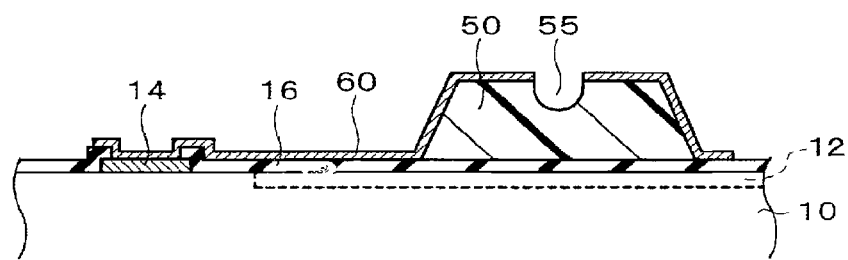

FIGS. 7A to 7B are views illustrative of a semiconductor device according to a second embodiment to which the invention is applied. FIG. 7A is a top view of a semiconductor device 2. FIG. 7B is a partially enlarged cross-sectional view along the line VIIB-VIIB in FIG. 7A.

The semiconductor device according to this embodiment includes a resin protrusion 50. The resin protrusion 50 is formed on the semiconductor substrate 10. The resin protrusion 50 may have a shape extending along one side of the semiconductor substrate 10. A depression 55 is formed in a top surface 52 of the resin protrusion 50. The depression 55 is formed under a through-hole 62 in an interconnect 60 (described later).

The semiconductor device according to this embodiment includes the interconnect 60 electrically connected with the electrode 14 and formed to extend over the resin protrusion 50. The through-hole 62 is formed in the interconnect 60. The through-hole 62 may be formed in the region over the resin protrusion 50. The shape of the through-hole 62 is not particularly limited. As shown in FIG. 7A, the through-hole 62 may be a circular hole. The through-hole 62 may be rectangular. A plurality of through-holes 62 may be formed in one interconnect 60. Or, only one through-hole 62 may be formed in one interconnect 60 (not shown). The through-hole 62 is disposed over the depression 55 in the resin protrusion 50. The through-hole 62 and the depression 55 in the resin protrusion 50 may have the same shape. The through-hole 62 may communicate with the depression 55.

The semiconductor device according to this embodiment may have the above-described configuration. This also allows the semiconductor device to be mounted without causing an adhesive to remain between the interconnect 60 and an interconnect of a circuit board. Specifically, the semiconductor device according to this embodiment allows provision of a semiconductor device which exhibits excellent mounting capability.

The method of manufacturing the semiconductor device 2 is not particularly limited. For example, the depression 55 may be formed by etching the resin protrusion using the interconnect 60 as a mask. Specifically, the depression 55 disposed under the through-hole 62 in the interconnect 60 may be formed in the resin protrusion by removing part of the resin protrusion. The above description may be applied to other steps. The semiconductor device 2 may be formed in this manner.

Figure 8A:
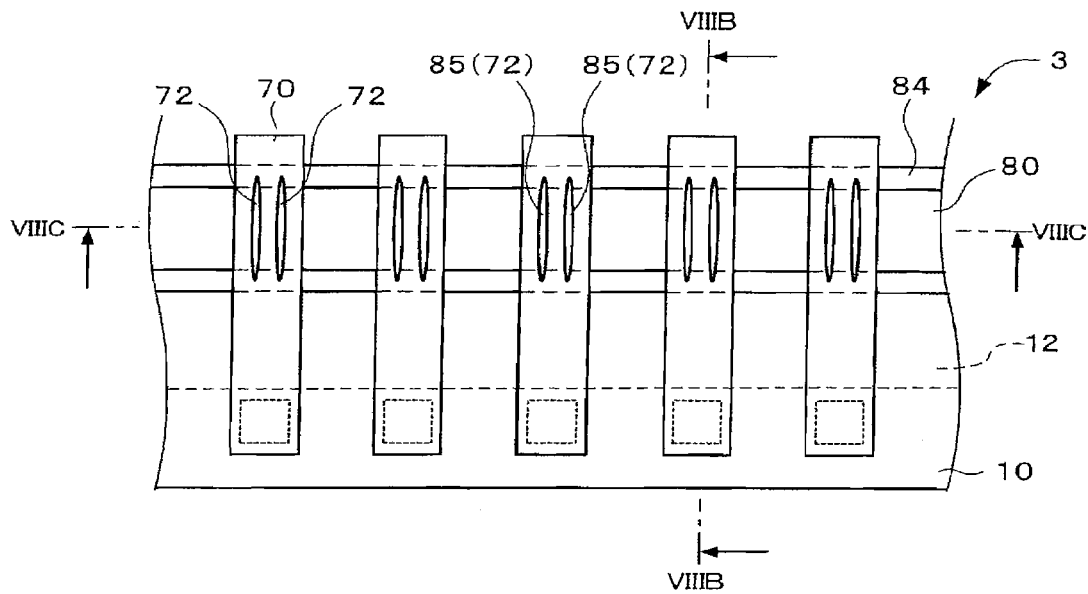
FIGS. 8A to 8C are diagrams illustrative of a semiconductor device according to a modification of the second embodiment.
Figure 8B:
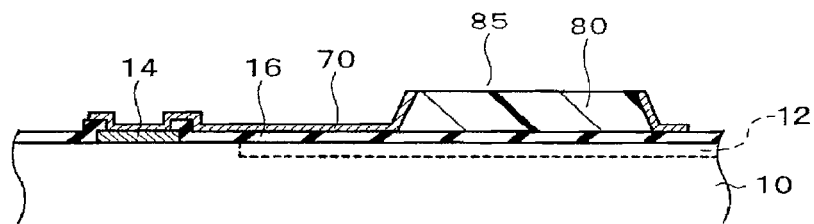
Figure 8C:
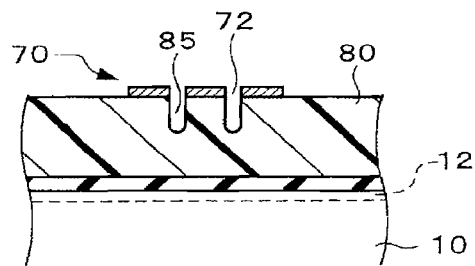

FIGS. 8A and 8B are views illustrative of a semiconductor device according to a modification of this embodiment. FIG. 8A is a top view of a semiconductor device 3. FIGS. 6B and 6C are partially enlarged cross-sectional views along the line VIIIB-VIIIB and the line VIIIC-VIIIC in FIG. 8A, respectively.

The semiconductor device according to this modification includes an interconnect 70. A through-hole 72 is formed in the interconnect 70. As shown in FIG. 8A, the through-hole 72 extends along the interconnect 70. The through-hole 72 may be formed to reach a lower portion 84 of a resin protrusion 80. A depression 85 disposed under the through-hole 72 is formed in the resin protrusion 80. The depression 85 extends along the interconnect 70. The depression 85 may be in the shape of a groove. The depression 55 may be formed to reach the lower portion 84 of the resin protrusion 80. The depression 85 may be formed to communicate with the side surface of the resin protrusion 80. This configuration also provides a semiconductor device exhibiting excellent mounting capability.

The invention is not limited to the above embodiments. Various modifications and variations may be made. For example, the invention includes various other configurations substantially the same as the configurations described in the embodiments (such as a configuration having the same function, method, and results, or a configuration having the same objective and results). The invention also includes a configuration in which an unsubstantial portion in the embodiments is replaced. The invention also includes a configuration having the same effects as the configurations described in the embodiments, or a configuration capable of achieving the same objective as the configurations described in the embodiments. Further, the invention includes a configuration in which a known technique is added to the configurations described in the embodiments.

Although only some embodiments of the invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A semiconductor device comprising:
    a semiconductor substrate having an electrode;
    a resin protrusion on the semiconductor substrate and having a groove formed in a top surface of the resin protrusion; and
    an interconnect electrically connected to the electrode and extending over the resin protrusion, the interconnect having a notch extending from an outboard edge of the resin protrusion and terminating at an inboard location of the resin protrusion, the notch being located over at least part of the groove in plan view so as to communicate with the groove.

2. The semiconductor device as defined in claim 1, wherein the top surface of the resin protrusion is flat.

3. A method of manufacturing a semiconductor device, comprising:
    providing a semiconductor substrate having an electrode;
    forming a resin protrusion on the semiconductor substrate;
    forming an interconnect on the semiconductor substrate such that the interconnect is electrically connected to the electrode, extends over a top surface of the resin protrusion, and has a notch extending from an outboard edge of the resin protrusion and terminating at an inboard location of the resin protrusion, the notch being disposed over the top surface of the resin protrusion in plan view; and
    after forming the interconnect, removing part of the resin protrusion under the notch to form a groove in the resin protrusion under the notch.

4. The method of manufacturing a semiconductor device as defined in claim 3, wherein the top surface of the resin protrusion is formed to be flat.

* * * * *